(12) United States Patent
Gulvin et al.

(10) Patent No.: US 6,508,947 B2
(45) Date of Patent: Jan. 21, 2003

(54) METHOD FOR FABRICATING A MICRO-ELECTRO-MECHANICAL FLUID EJECTOR

(75) Inventors: Peter M. Gulvin, Webster, NY (US); Elliott A. Eklund, Penfield, NY (US)

(73) Assignee: Xerox Corporation, Stamford, CT (US)

( * ) Notice: Subject to any disclaimer, the term of this patent is extended or adjusted under 35 U.S.C. 154(b) by 183 days.

(21) Appl. No.: 09/768,688

(22) Filed: Jan. 24, 2001

(65) Prior Publication Data

US 2002/0096488 A1 Jul. 25, 2002

(51) Int. Cl.⁷ .............................. H01L 21/00; B44C 1/22
(52) U.S. Cl. .............................. 216/27; 216/2; 438/719; 438/745
(58) Field of Search .................... 216/27, 67, 2; 438/719, 723, 738, 739, 745

(56) References Cited

U.S. PATENT DOCUMENTS

| | | | |
|---|---|---|---|
| 4,867,842 A | * | 9/1989 | Bohrer et al. .......... 438/739 X |
| 4,885,783 A | | 12/1989 | Whitehead et al. ......... 381/191 |
| 5,725,363 A | | 3/1998 | Bustgens et al. ........ 417/413.1 |

FOREIGN PATENT DOCUMENTS

| | | |
|---|---|---|
| JP | 57079797 | 5/1982 |
| JP | 10304685 | 11/1998 |
| JP | 2000052549 | 2/2000 |

* cited by examiner

*Primary Examiner*—William A. Powell
(74) *Attorney, Agent, or Firm*—Lloyd F. Bean, II

(57) ABSTRACT

A method for fabricating a membrane having a corrugated, multi-layer structure, comprising the steps of: providing a substrate having an insulator layer on the top surface of the substrate, a conductive layer on the insulator layer, a sacrificial layer on said conductive layer, and a second conductive layer; patterning a series of holes the second conductive layer to allow release etchant to have access to a second sacrificial layer; depositing the second sacrificial layer onto said second conductive layer so that the series of holes are filled with the second sacrificial layer; patterning the second sacrificial layer with a radial and/or concentric grid pattern so that a third conductive layer when deposited will form the support structure and top portion of the corrugated structure; depositing the third conductive layer so that the grid pattern is filled in and is in contact with the second conductive layer; removing the first and second sacrificial layer by immersing the device in a release etchant.

2 Claims, 5 Drawing Sheets

US 6,508,947 B2

METHOD FOR FABRICATING A MICRO-ELECTRO-MECHANICAL FLUID EJECTOR

BACKGROUND OF THE INVENTION

The present invention relates to electrostatically actuated devices and more particularly to silicon-based actuators having a corrugated, multi-layer silicon membrane structure for increased rigidity.

Cross-reference is made to co-pending application U.S. Pat. Nos. 6,357,865, 6,467,879, and U.S. patent application Ser. No. 09/768,676 entitled "Electrostatically-Acutated Device Having A Corrugated Multi-Layer Membrane Structure" filed concurrently herewith, the entire disclosure of which is hereby incorporated by reference.

In ink-jet printing, droplets of ink are selectively ejected from a plurality of drop ejectors in a printhead. The ejectors are operated in accordance with digital instructions to create a desired image on a print medium moving past the printhead. The printhead may move back and forth relative to the sheet in a typewriter fashion, or in the linear array may be of a size extending across the entire width of a sheet, to place the image on a sheet in a single pass.

The ejectors typically comprise actuators connected to both a nozzle or drop ejection aperture and to one or more common ink supply manifolds. Ink is retained within each channel until there is a response by the actuator to an appropriate signal. In one embodiment of the ejector, the ink drop is ejected by the pressure transient due to volume displacement of an electrostatically- or magnetostatically-actuated deformable membrane, which typically is a capacitor structure with a flexible electrode, fixed counter electrode, and actuated by a voltage bias between the two electrodes.

Silicon-based actuators can also be employed in micro-electromechanical devices that can be used for pumping and switching, and wherein for example, silicon based actuators are, respectively, used for microfluid pumping, and optical switching. Fluids are pumped due to the volume displacement of an electrostatically- or magnetostatically-deformable membrane, which is a capacitor structure with a flexible electrode, fixed counter electrode, and actuated by a voltage bias between the two silicon electrodes. Optical switching occurs by the displacement of optical elements as a result of actuation due to electrostatic or magnetostatic interactions with other on-chip elements or a magnetostatic device package. For example, in optical switching a mirror can be employed as the optical element using electrostatic actuators to provide the displacement.

This capacitor structure which incorporates a deformable membrane for these silicon-based actuators can be fabricated in a standard polysilicon surface micro-machining process. It can be batch fabricated at low cost using existing silicon foundry capabilities. The surface micro-machining process has proven to be compatible with integrated microelectronics, allowing for the monolithic integration of the actuation with associated addressing electronics.

A problem associated with using such devices as actuators in ink jet printing is that to generate the pressure required for ejecting ink drops from the print head, the membrane must be sufficiently rigid. Apart from increasing the membrane thickness or using stiffer material, which may not be allowed in a standardized surface-micromachining fabrication process, one solution is to make the membrane smaller. However, as the membrane shrinks, so does the displacement volume, and thus the size of the drop emitted. Therefore, it is desirable to increase the ink jet drop ejector ability to eject useful-sized drops of ink without decreasing the size of the ejector or increasing the thickness of the membranes.

SUMMARY OF THE INVENTION

A method for fabricating a membrane having a corrugated, multi-layer structure, comprising the steps of: providing a substrate having an insulator layer on the top surface of the substrate, a conductive layer on the insulator layer, a sacrificial layer on said conductive layer, and a second conductive layer; patterning a series of holes the second conductive layer to allow release etchant to have access to a second sacrificial layer; depositing the second sacrificial layer onto said second conductive layer so that the series of holes are filled with the second sacrificial layer; patterning the second sacrificial layer with a radial and/or concentric grid pattern so that a third conductive layer when deposited will form the support structure and top portion of the corrugated structure; depositing the third conductive layer so that the grid pattern is filled in and is in contact with the second conductive layer; removing the first and second sacrificial layer by immersing the device in a release etchant.

These and other aspects of the invention will become apparent from the following description, the description being used to illustrate a preferred embodiment of the invention when read in conjunction with the accompanying drawings.

DETAILED DESCRIPTION OF THE INVENTION

While the present invention is described below with reference to an ink-jet printhead, a practitioner in the art will recognize the principles of the present invention are applicable to other applications as discussed supra.

Figure 11:
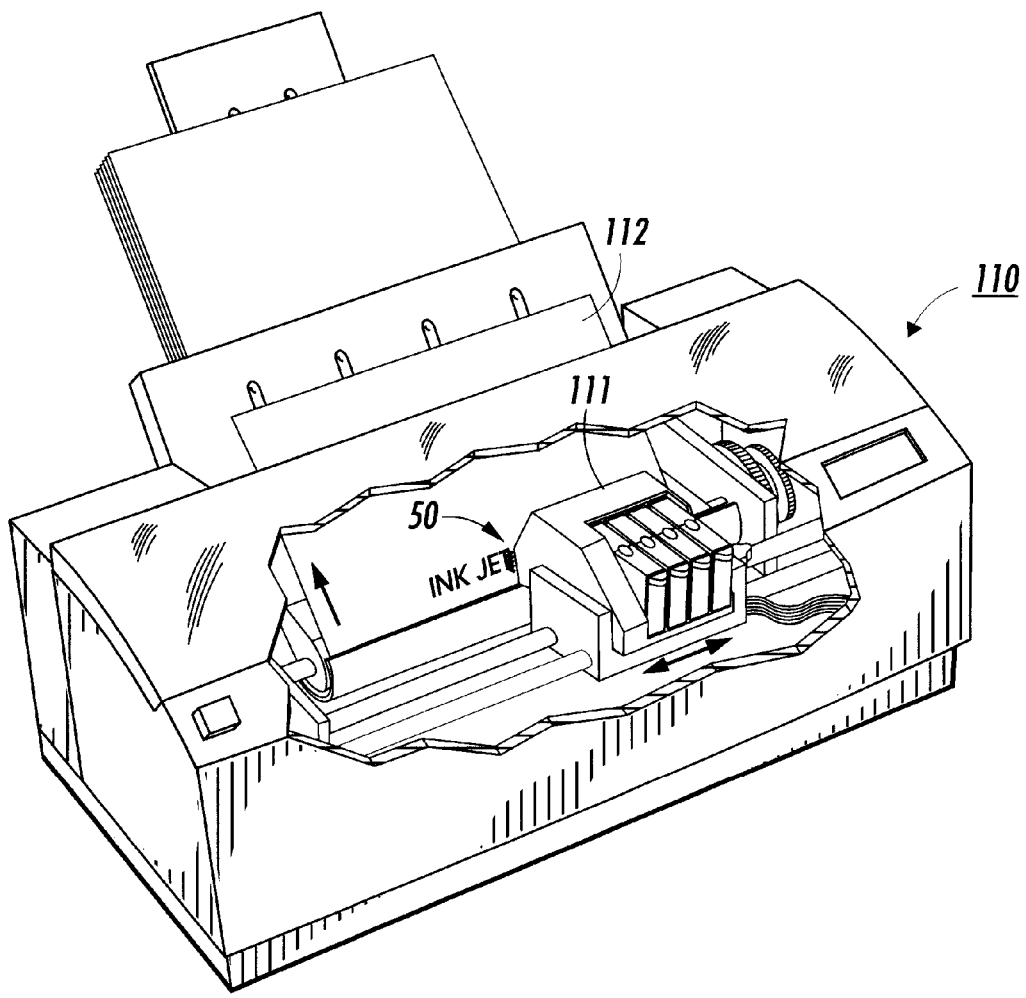
FIG. 11 shows an ink-jet printer with a drop ejector printhead.

Now referring to FIG. 11, incorporating the printhead 111 and actuator drop ejector 50 of the present invention, in an ink-jet printer 110, droplets of ink are ejected from several drop ejectors 50 in printhead 111, onto a sheet 112. The ejectors are operated in accordance with digital instructions to create a desired image on a print medium moving past the printhead 111. The printhead 111 may move back and forth relative to the sheet in a scanning motion to generate the printed image swath by swath. Alternately, the printhead may be held fixed and the media moved relative to it, creating an image as wide as the printhead in a single pass.

Turning to FIGS. 1–4, the drop ejector utilizes deformable membrane 50 as an actuator. The membrane can be formed using standard polysilicon surface micro-machining, where the polysilicon structure that is to be released is deposited on a sacrificial layer that is finally removed. Electrostatic forces between deformable membrane 50 and counter-electrode 40 deform the membrane. In one embodiment the membrane is actuated using a voltage drive mode, in which the voltage difference is controlled between the parallel plate conductors that form the membrane 50 and the counter-electrode 40, which is useful for a drop generating device that ejects a constant drop size. In another mode of operation the membrane is actuated using a charge drive mode, wherein the charge between the parallel plate conductors is controlled, thus enabling a variable drop size device. The two different modes of operation, voltage drive and charge drive, lead to different actuation forces but either use the same or a different power source.

Actuator chamber 54 can either be sealed at some other pressure, or open to atmosphere to allow the air in the actuator chamber to escape (hole not shown). For grayscale printing, which uses the charge-drive mode, the membrane can be pulled down to an intermediate position. The volume reduction in the actuator chamber will later determine the volume of fluid displaced when an upper chamber and nozzle plate has been added. Nozzle plate (not shown) is located above electrostatically actuated membrane 50, forming a fluid pressure chamber between the nozzle plate and the membrane. Nozzle plate has nozzle formed therein. Fluid is fed into this chamber from a fluid reservoir (not shown). The fluid pressure chamber can be separated from the fluid reservoir by a check valve to restrict fluid flow from the fluid reservoir to the fluid pressure chamber. The membrane is initially pulled-down by electrostatic forces generated by an applied voltage between the membrane and counter-electrode. Fluid fills in the displaced volume in the fluid pressure chamber created by the membrane deflection and is ejected through the nozzle when the membrane is released by removing the applied voltage.

Substrate 20 is typically a silicon wafer. However, substrate 20 may be any flat substrate such as glass or metal with a thin insulating film. Insulator 30 is typically a thin film of silicon nitride. Conductor 40 acts as the counter electrode and is typically either a metal or a doped semiconductor film such as polysilicon. Membrane 50 is made from a structural material such as polysilicon, and is typically fabricated in a surface micro-machining process. It can also be another conducting material such as thin metallic film. Inner structure 56 is attached to a part of membrane 50 and together with the isolated landing pad 43 acts to prevent the membrane from touching the conductor in an area where voltage has been applied. Actuator chamber 54 between membrane 50 and substrate 20 can be formed using typical techniques such as are used in surface micro-machining. A sacrificial layer such as silicon dioxide, deposited by chemical vapor deposition (CVD), is then covered over by the structural material that forms the membrane. Openings left at the edge of the membrane (not shown) allow the sacrificial layer to be removed between the membrane and counter-electrode in a post-processing etch. A typical etchant for oxide is concentrated hydrofluoric acid. In this processing step inner structure 56 acts to keep the membrane from sticking to the underlying surface when the liquid etchant capillary forces pull it down during drying.

Typically the flexible membrane 50 is thin. When a voltage is applied the membrane 50 is actuated (pulled down) by the electrostatic force between it and the fixed counter electrode 40. An inner structure 56 on the underside of the membrane 50 rests on the electrically-isolated center section (landing pad) 43 of the counter electrode. The outer structure 58 and insulated landing pad 42 are similar to the inner structure 56 and the isolated landing pad 43. The outer structure 58 and insulated landing pad 42 are fabricated in the silicon surface micro-machining process, and consist of protrusions on the underside of the membrane 50 with corresponding landing pads patterned in the counter-electrode 40. The outer structure 58 and insulated landing pad 42 serve to define a minimum electrode 40 spacing in area 53 where contact is likely to occur, thus preventing arcing and actuator 10 failure. The outer structure 58 is located outwardly from the inner structure 56, at an outwardly position from inner structure 56, at a distance from the inner structure 56 that minimizes excessive flexing of the membrane 50 at the susceptible region 53. By defining a minimum electrode 40 spacing similar or equal to the spacing at the actuator 10 center, contact and resulting arcing will be eliminated and the life of the actuator 10 will be lengthened significantly.

Now referring to the present invention in more detail, the present invention is an actuator having a corrugated, multi-layer silicon membrane structure for increased membrane rigidity.

Figure 1:
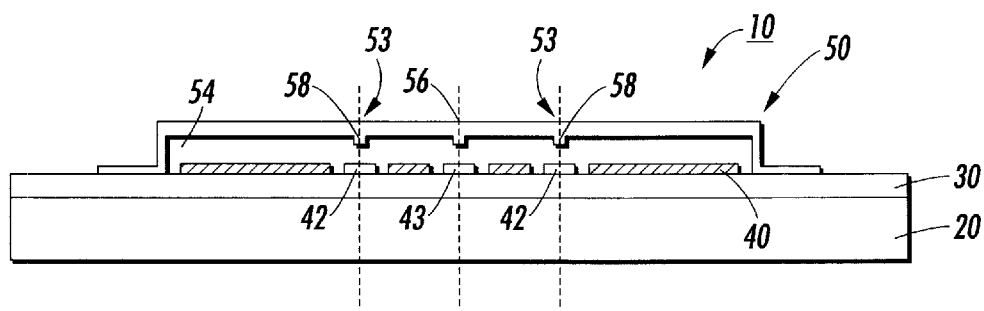
FIG. 1 shows a cross-sectional view of the electrostatically actuated membrane in its undeflected state.
Figure 2:
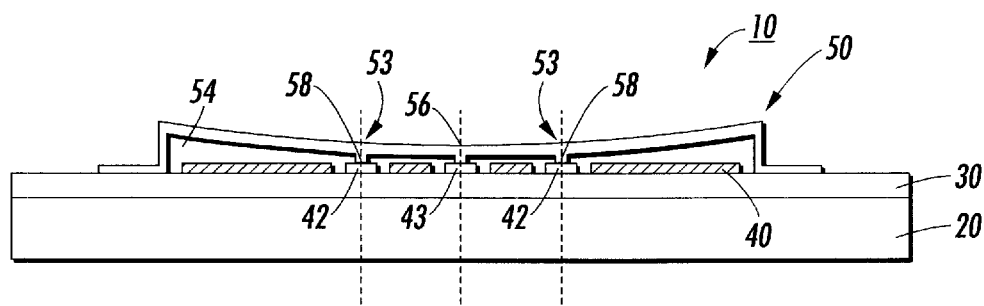
FIG. 2 shows a cross-sectional view of the electrostatically actuated membrane in its deflected state.
Figure 3:
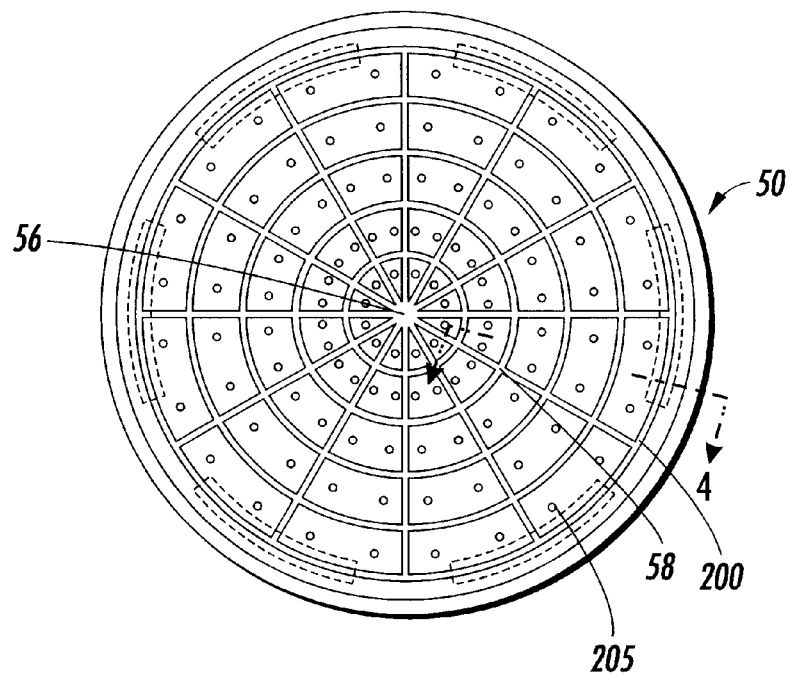
FIG. 3 shows a top-view of the corrugated electrostatically actuated membrane with radial and concentric support structures.
Figure 4:
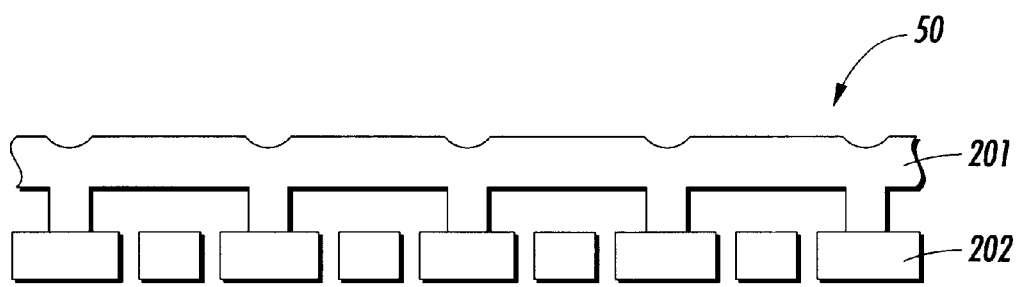
FIG. 4 shows a cross-sectional view of the electrostatically actuated membrane of FIG. 3.
Figure 5:
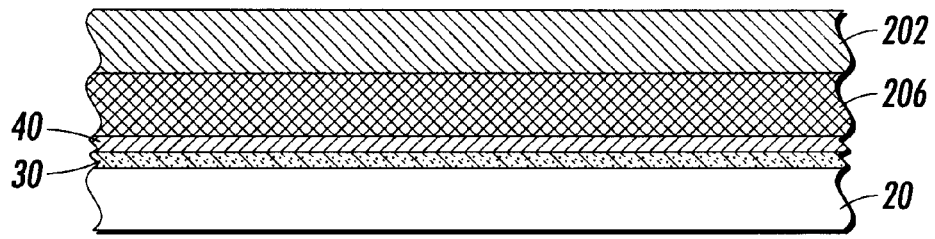
FIGS. 5–10 show the basic process steps in a standard poly-silicon surface micro-machining process.

FIGS. 3 and 4 show a corrugated, multi-layer structure. The structure is made by patterning concentric circular and/or radial holes in the oxide layer between the top and the bottom polysilicon layers. The concentric rings and radial segments in FIG. 3 correspond to places where the top layer of poly-silicon 201 drops down to contact the bottom polysilicon layer 202. The space in between the layer is originally filled with silicon dioxide, but the etch holes in the bottom poly-silicon layer allow the oxide to be dissolved in the release process. Alternatively, the oxide could be left in place, in which case the etch holes are not needed. The removal of the oxide is likely to reduce the overall stress and stress-induced bending of the device.

The invention has many advantages. It enables a membrane of increased rigidity without reducing the size of the membrane. When used to generate drops in ink jet printing, a smaller membrane would produce a smaller displacement volume and thus, smaller ink drops. In addition, the invention enables stiffer actuator membranes while still using the standard thicknesses of the component layers in the standard polysilicon surface micro-machining process. Thicker layers are indeed possible to a point, but represent highly non-standard and non-optimal process conditions, likely leading to unacceptably low device yields from the fabrication process.

It is possible to fabricate thicker membranes, which have increased rigidity, by simply stacking layers of poly-silicon and oxide in the surface micromachining process. However, this leads to large regions where oxide layers are enclosed between poly-silicon layers, causing problems with warping due to high amounts of internal stress in these multilayer structures. The current invention avoids these problems by making the regions of enclosed oxide smaller and allowing for their release during fabrication.

More rigid poly-silicon membranes can be fabricated by stacking polysilicon layers only, removing the intervening oxide layer before deposition of the 2nd poly-silicon layer. However, this approach only doubles the thickness, whereas the current invention enables corrugated structures which have the rigidity of much thicker poly-silicon membranes.

The actuator structure and, in particular, the corrugated membrane of the present invention can be formed using the well-known polysilicon surface micro-machining process. Corrugated structures of this type can also be fabricated from materials other than silicon using other microfabrication processes not discussed here. A basic sequence of process steps in poly-silicon surface micro-machining is shown in FIGS. 5–10. In the beginning of the wafer processing, there is a silicon substrate wafer 20, a Low Pressure Chemical Vapor Deposition (LPCVD) low stress silicon nitride electrically insulating layer 30 approximately 0.6 µm thick, a 0.5- µm LPCVD low stress polysilicon layer (poly 0) 202, and a photoresist layer (not shown). The silicon substrate wafer is typically 525 µm in thickness, n or p-type, with 0.5 ohm-cm resistivity. The surface wafer is heavily doped with phosphorous in a standard diffusion furnace using POCL3 as the dopant source, to reduce charge feed through to the substrate from the electrostatic devices on the surface. A photoresist layer (not shown) is used for patterning the poly 0 layer 202.

Figure 6:
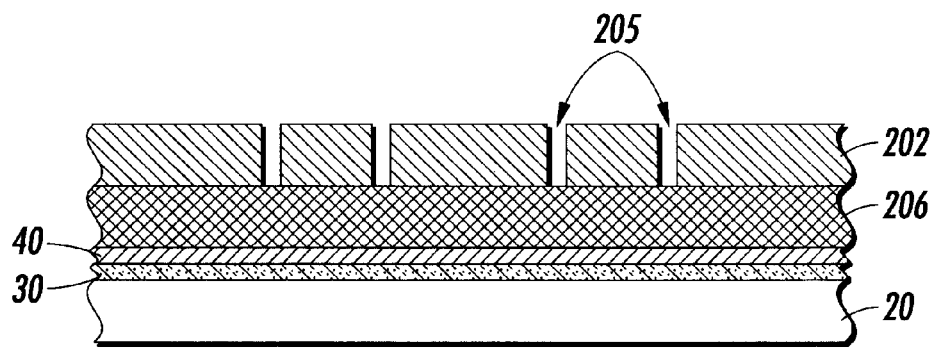
Figure 7:
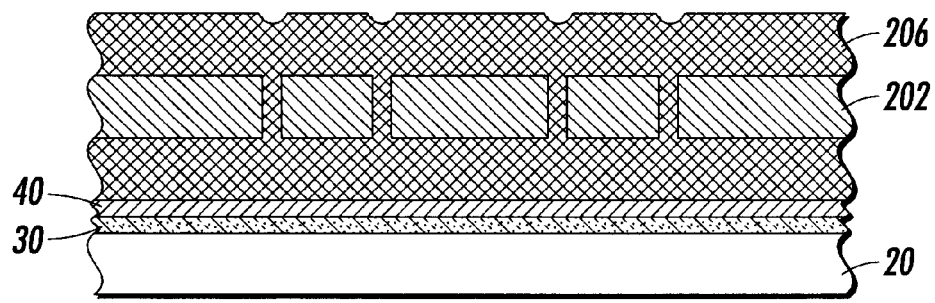

In FIG. 6, photoresist is patterned, and this pattern is transferred into the polysilicon (or poly) layer using Reactive Ion Etching (RIE). A 2.0 µm Phospho-Silicate Glass (PSG) sacrificial layer (Oxide 1) is then deposited by LPCVD. The glass layer is patterned using photoresist layer (not shown) to create a small hole 205 approximately 0.75 µm deep.

Figure 8:
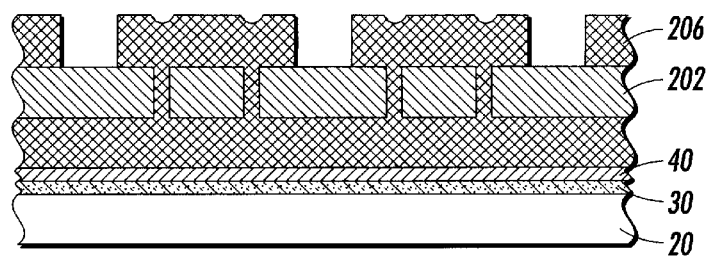
Figure 9:
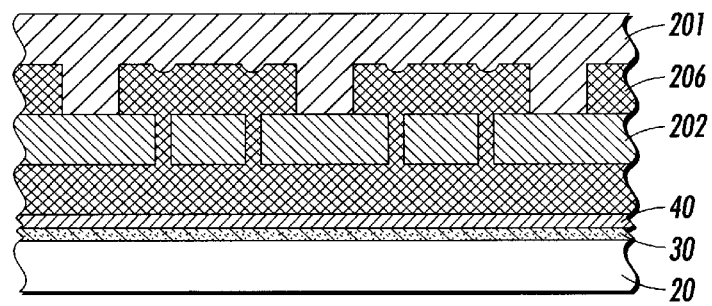

In FIG. 8, unwanted oxide 1 layer is selectively removed using RIE, and then the photoresist is stripped, and an additional polysilicon layer 201, approximately 2.0 µm thick is deposited as shown in FIG. 9. The two layers 202 and 201 form the corrugated membrane actuator 50.

Figure 10:
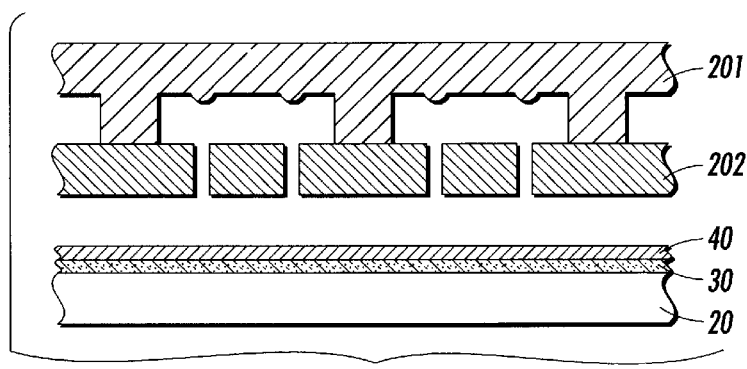

In FIG. 10, the sacrificial oxide 1 layer has been etched, using wet or dry etching through etch holes (shown as 205 in FIG. 6), to release the membrane 50 so that it can be mechanically actuated. An alternative method for creating release etch holes that is not shown in the figures is to have the holes come from the backside of the wafer. This is possible by using wet anisotropic etching technology similar to the etching technology used in forming the reservoir in the state of the art thermal ink jet devices, or using dry etching techniques such as Deep Reactive Ion Etching (DRIE). An etch hole can also be formed on the front side of the wafer, by providing a continuous oxide pathway through the side of the membrane 50. This pathway can be protected from refill by the fluid in the pressure chamber design formed in the thick polyimide. While there has been illustrated and described what is at present considered to be a preferred embodiment of the present invention, it will be appreciated that numerous changes and modifications are likely to occur to those skilled in the art. It is intended in the appended claims to cover all those changes and modifications which fall within the spirit and scope of the present invention.

What is claimed is:

1. A method for fabricating a membrane having a corrugated, multi-layer structure, comprising the steps of:

providing a substrate having an insulator layer on the top surface of the substrate, a conductive layer on the insulator layer, a sacrificial layer on said conductive layer, and a second conductive layer;

patterning a series of holes the second conductive layer to allow release etchant to have access to a second sacrificial layer;

depositing the second sacrificial layer onto said second conductive layer so that the series of holes are filled with the second sacrificial layer;

patterning the second sacrificial layer with a radial and/or concentric grid pattern so that a third conductive layer when deposited will form the support structure and top portion of the corrugated structure;

depositing the third conductive layer so that the grid pattern is filled in and is in contact with the second conductive layer;

removing the first and second sacrificial layer by immersing the device in a release etchant.

2. A method of fabricating a micro-electromechanical fluid ejector, comprising:

providing a substrate having an insulator layer on the top surface of the substrate, a conductive layer on the insulator layer, a sacrificial layer on said conductive layer, and a second conductive layer;

patterning a series of holes the second conductive layer to allow release etchant to have access to a second sacrificial layer;

depositing the second sacrificial layer onto said second conductive layer so that the series of holes are filled with the second sacrificial layer;

patterning the second sacrificial layer with a radial and/or concentric grid pattern so that a third conductive layer when deposited will form the support structure and top portion of the corrugated structure;

depositing the third conductive layer so that the grid pattern is filled in and is in contact with the second conductive layer;

removing the first and second sacrificial layer by immersing the device in a release etchant.

* * * * *